(12) United States Patent
Harney et al.

(10) Patent No.: US 6,936,918 B2
(45) Date of Patent: Aug. 30, 2005

(54) MEMS DEVICE WITH CONDUCTIVE PATH THROUGH SUBSTRATE

(75) Inventors: Kieran P. Harney, Andover, MA (US); Lawrence E. Felton, Hopkinton, MA (US); Thomas Kieran Nunan, Carlisle, MA (US); Susan A. Alie, Stoneham, MA (US); Bruce Wachtmann, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/827,680

(22) Filed: Apr. 19, 2004

(65) Prior Publication Data

US 2005/0127499 A1 Jun. 16, 2005

Related U.S. Application Data

(63) Continuation-in-part of application No. 10/737,231, filed on Dec. 15, 2003.

(51) Int. Cl.$^7$ .............................................. H01L 23/12
(52) U.S. Cl. ...................... 257/704; 257/777; 257/730; 257/774; 257/750; 257/754
(58) Field of Search ............................... 257/704, 777, 257/774, 750, 754

(56) References Cited

U.S. PATENT DOCUMENTS

| | | | |
|---|---|---|---|
| 5,314,572 A | 5/1994 | Core et al. | 156/643 |
| 5,326,726 A | 7/1994 | Tsang et al. | 437/228 |
| 5,345,824 A | 9/1994 | Sherman et al. | 73/517 |
| 5,417,111 A | 5/1995 | Sherman et al. | 73/517 |
| 5,511,428 A | 4/1996 | Goldberg et al. | 73/777 |
| 5,540,095 A | 7/1996 | Sherman et al. | 73/514.18 |
| 5,610,431 A | 3/1997 | Martin | 257/415 |
| 5,620,931 A | 4/1997 | Tsang et al. | 438/50 |
| 5,872,496 A | 2/1999 | Asada et al. | 335/78 |
| 6,153,839 A | 11/2000 | Zavracky et al. | 200/181 |
| 6,303,986 B1 * | 10/2001 | Shook | 257/680 |
| 6,307,169 B1 | 10/2001 | Sun et al. | 200/181 |
| 6,335,224 B1 * | 1/2002 | Peterson et al. | 438/114 |
| 6,384,353 B1 | 5/2002 | Huang et al. | 200/181 |
| 6,429,511 B2 | 8/2002 | Ruby et al. | 257/704 |
| 6,433,411 B1 * | 8/2002 | Degani et al. | 257/678 |
| 6,436,853 B2 * | 8/2002 | Lin et al. | 438/800 |
| 6,448,109 B1 | 9/2002 | Karpman | 438/108 |
| 6,448,622 B1 * | 9/2002 | Franke et al. | 257/415 |
| 6,452,238 B1 | 9/2002 | Orcutt et al. | 257/415 |
| 6,512,300 B2 | 1/2003 | Cheever et al. | 257/777 |
| 6,559,530 B2 | 5/2003 | Hinzel et al. | 257/684 |
| 6,630,725 B1 | 10/2003 | Kuo et al. | 257/659 |
| 6,633,079 B2 | 10/2003 | Cheever et al. | 257/723 |

(Continued)

OTHER PUBLICATIONS

Boustedt et al., "Flip Chip as an Enabler for MEMS Packaging", 2002 Electronic Components and Technology Conference, pp. 124-128.

(Continued)

*Primary Examiner*—Jasmine Clark
(74) *Attorney, Agent, or Firm*—Bromberg & Sunstein LLP

(57) ABSTRACT

A MEMS device has at least one conductive path extending from the top facing side of its substrate (having MEMS structure) to the bottom side of the noted substrate. The at least one conductive path extends through the substrate as noted to electrically connect the bottom facing side with the MEMS structure.

23 Claims, 6 Drawing Sheets

U.S. PATENT DOCUMENTS

| | | | |
|---|---|---|---|
| 6,743,656 B2 | 6/2004 | Orcutt et al. | 438/66 |
| 6,753,208 B1 | 6/2004 | MacIntyre | 438/118 |
| 6,781,239 B1 * | 8/2004 | Yegnashankaran et al. | 257/777 |
| 6,852,926 B2 * | 2/2005 | Ma et al. | 174/52.2 |
| 2003/0038327 A1 | 2/2003 | Smith | 257/415 |
| 2004/0016989 A1 * | 1/2004 | Ma et al. | 257/528 |
| 2004/0077154 A1 | 4/2004 | Nagarajan et al. | 438/455 |

OTHER PUBLICATIONS

Ok et al., Generic, Direct-Chip-Attach MEMS Packaging Design with High Density and Aspect Ration through-Wafer Electrical Interconnect, 2002 Electronic Components and Technology Conference, pp. 232-237.

Ziptronix White Paper, "MEMS: Mainstream Process Integration".

Teomim et al, "An innovative approach to wafer-level MEMS packaging", pp. 1-4.

ShellBGA www.shellcase.com/pages/products-shellbga.asp.

Seeger et al. Fabrication challenges for next-generation devices: Microelectromechanical systems for radio-frequency wireless communications, @2003 Society of Photo-Optical Instrumentation Engineers, pp. 169-177, Jul. 2003.

Park et al., *A Novel-Low-Loss Wafer-Level Packaging of the RF-MEMS Devices*, 2002 IEEE, Doc. No. 0-7803-7185, Feb. 2002, 681-684, 4 pages.

Ok et al., *High Density, High Aspect Ratio Through-Wafer Electrical Interconnect Vias for MEMS Packaging*, 2003 IEEE Transactions on Advanced Packaging, vol. 26, No. 3, Doc. No. 1521-3323, Aug. 2003, 302-309, 8 pages.

Premachandran et al., *A Novel Electrically Conductive Wafer Through Hole Fille Vias Interconnect for 3D MEMS Packaging*, 627-630, 2003, 4 pages.

Ando et al., *New Packaging Technology for SAW Device*, Corporate Components Development Center, Doc. No. WA1-3, 403-406, 4 pages.

* cited by examiner

MEMS DEVICE WITH CONDUCTIVE PATH THROUGH SUBSTRATE

PRIORITY

This patent application is a continuation-in-part of and thus, claims priority from, U.S. patent application Ser. No. 10/737,231, filed Dec. 15, 2003, entitled, "SEMICONDUCTOR ASSEMBLY WITH CONDUCTIVE RIM AND METHOD OF PRODUCING THE SAME," and naming Susan A. Alie, Michael Judy, Bruce K. Wachtmann, and David Kneedler as inventors, the disclosure of which is incorporated herein, in its entirety, by reference.

FIELD OF THE INVENTION

The invention generally relates to MEMS devices and, more particularly, the invention relates to electrically communication of MEMS devices.

BACKGROUND OF THE INVENTION

Microelectromechanical systems (i.e., "MEMS") are highly miniaturized devices that can be configured to perform a wide variety of functions. For example, a MEMS device can be implemented as an accelerometer to measure the acceleration of a moving body. One type of MEMS accelerometer, for example, uses a suspended mass that, in response to an acceleration, moves relative to an underlying substrate. Acceleration thus may be calculated as a function of the movement of the suspended mass relative to its underlying substrate.

Circuitry controls many aspects of MEMS operation. For example, the above noted suspended mass may be in electrical communication with off-chip circuitry that detects mass movement. Based upon the amount of such detected movement, the circuitry can calculate the acceleration value.

One widely implemented method of electrically communicating MEMS structure with circuitry involves use of a bond pad. Specifically, the MEMS device has leads that connect with the bond pad, which typically is laterally spaced on the substrate from the MEMS structure. Such an arrangement, however, has various disadvantages. Among others, the bond pad uses a relatively significant surface area on the substrate, which typically is at a premium. In addition, the bond pad and its leads often produce a parasitic capacitance that can corrupt the basic electronic signal produced by the MEMS device.

SUMMARY OF THE INVENTION

In accordance with one aspect of the invention, a MEMS device has at least one conductive path extending from the top facing side of its substrate (having MEMS structure) to the bottom side of the noted substrate. The at least one conductive path extends through the substrate as noted to electrically connect the bottom facing side with the MEMS structure.

Some embodiments include a cap about at least a portion of the MEMS structure. The cap and substrate illustratively form a cavity that at least in part contains the MEMS structure. In some embodiments, the at least one conductive path is substantially flush with or extends outwardly from the bottom facing side of the substrate. To facilitate an electrical connection, a solder ball may be secured to the at least one conductive path.

The conductive path may be formed by a number of different materials, such as polysilicon. The MEMS structure illustratively has a movable mass, such as those used in a gyroscope or accelerometer. Moreover, the MEMS device also may have circuitry supported by the substrate. The circuitry illustratively is in electrical communication with the at least one conductive path. In such case, the substrate may include silicon germanium.

In accordance with another aspect of the invention, a MEMS system has 1) a first substrate with circuitry and an interface port to the circuitry, and 2) a MEMS device having a second substrate with a top facing side and a bottom facing side. The top facing side includes MEMS structure. The MEMS device also has a conductive path extending through the second substrate from the MEMS structure to the bottom facing side. The conductive path is coupled with the interface port on the first substrate to electrically communicate the circuitry with the MEMS structure.

In illustrative embodiments, the MEMS device is free of circuitry. Moreover, the MEMS device may have an insulator positioned between the conductive path and at least a part of the second substrate. In some embodiments, the MEMS structure defines a plan boundary on the second substrate (i.e., an area on the second substrate). The conductive path may be within the plan boundary.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a conductive path (e.g., a via) extending through the substrate of a MEMS device can electrically couple on-substrate MEMS structure with corresponding circuitry. Such circuitry, which may control and/or detect movement of the MEMS structure, may be on another substrate or on the same substrate as the MEMS structure. If the via is positioned directly underneath the MEMS structure (e.g., in the planview), it does not require additional substrate real estate. Moreover, it is anticipated that such an arrangement should produce less parasitic capacitance than prior art arrangements using bond pads. Details of various embodiments are discussed below.

Figure 1:
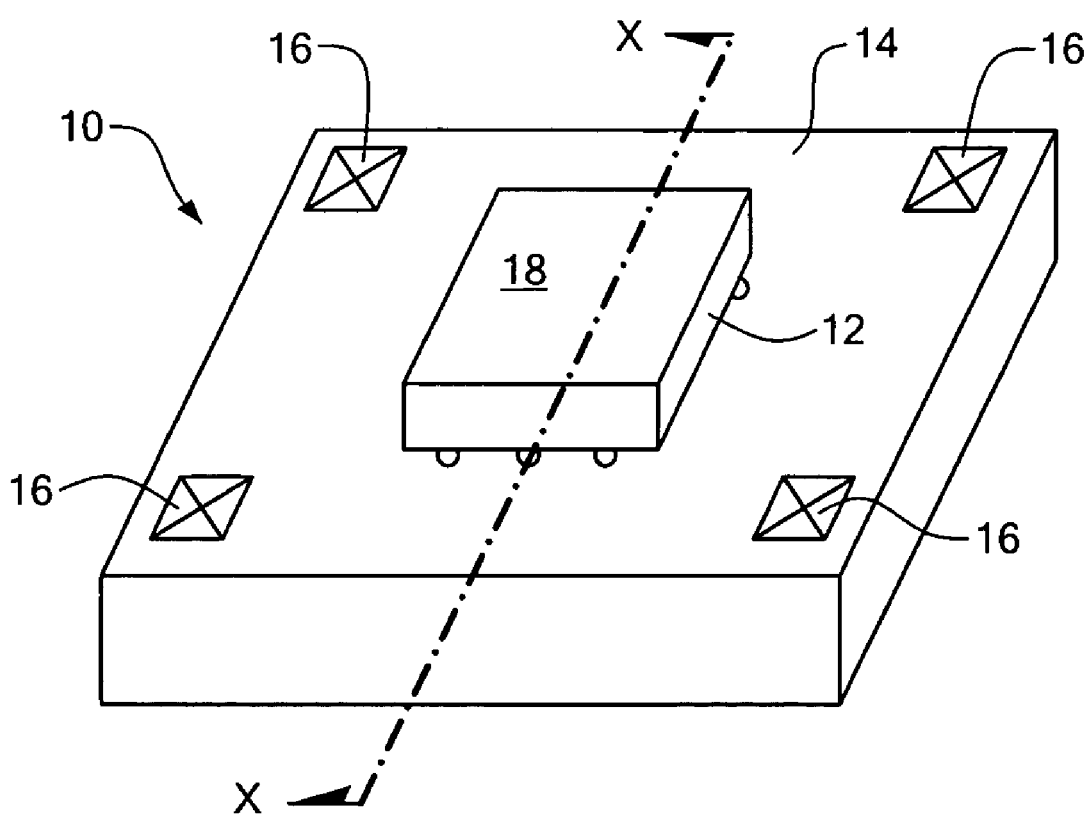
FIG. 1 schematically shows a perspective view of an electronic device that may be capped in accordance with illustrative embodiments of the invention.

FIG. 1 schematically shows a generic MEMS device 10 that may be configured in accordance with illustrative embodiments of the invention. The MEMS device 10 shown includes a capped MEMS die 12 coupled with a circuit die 14. Accordingly, the MEMS die 12 shown has structure that is controlled and/or monitored by circuitry on the circuit die 14. The circuit die 14 has bond pads 16 or other interconnects to electrically communicate with an external device, such as a computer. To further protect the MEMS device 10 from the environment, conventional processes may mount the entire MEMS device 10 within a package.

The MEMS device 10 may be any conventionally known MEMS device 10, such as an inertial sensor. For example, the MEMS device 10 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Figure 2:
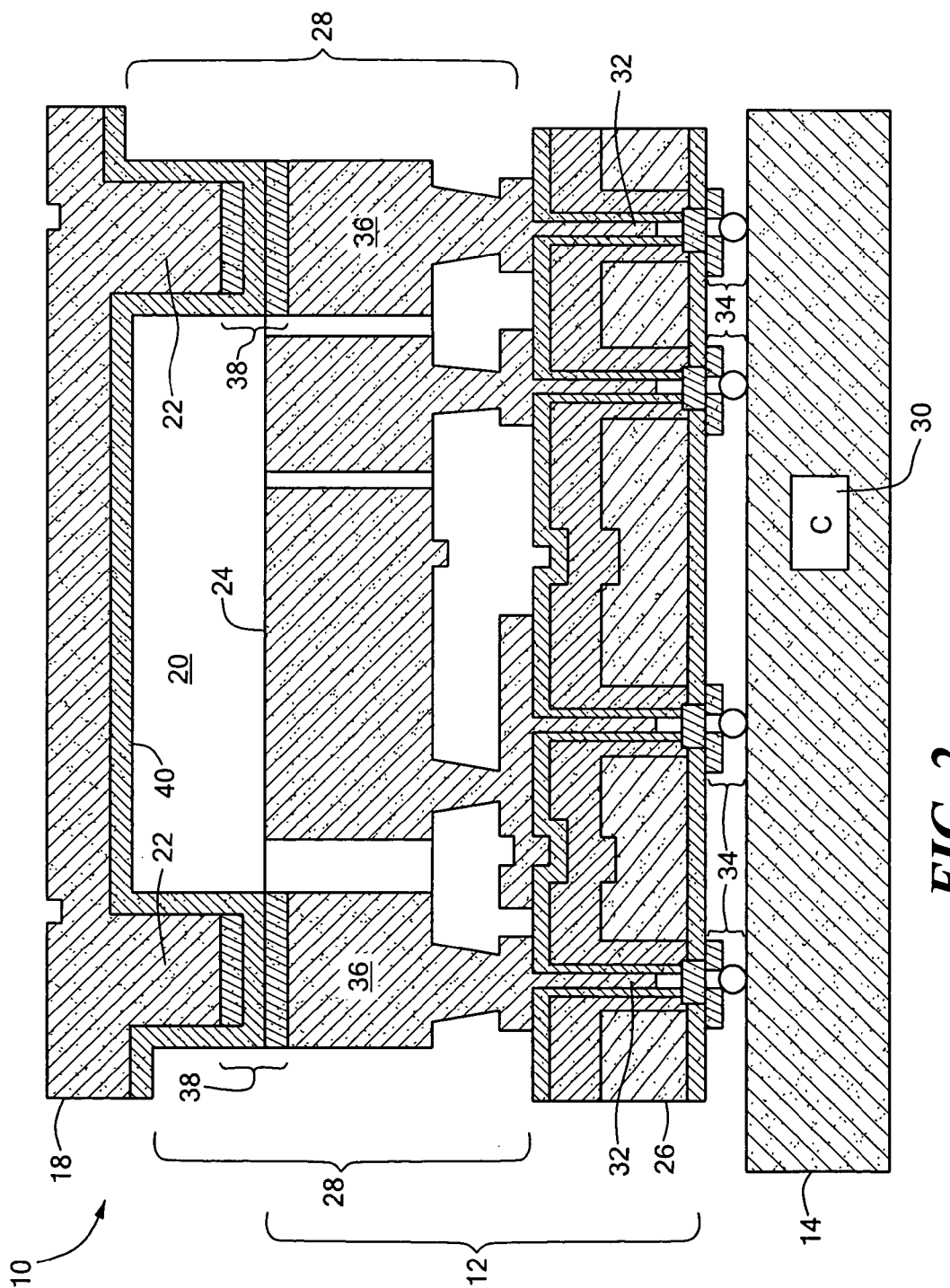
FIG. 2 schematically shows a cross-sectional view of the device shown in FIG. 1 along line X—X, where the device is configured in accordance with one embodiment of the invention.

FIG. 2 schematically shows a cross-sectional view of the device shown in FIG. 1 along line X—X. Specifically, the MEMS device 10 includes the above noted MEMS die 12 (e.g., comprised of a silicon-based material, such as silicon) having a silicon-based cap 18 mounted to its top side, and the above noted circuit die 14 mounted to its bottom side. The cap 18 illustratively is formed from polysilicon (or single crystal silicon) and etched to have a cavity 20 defined by a cap rim 22 extending from its interior side. The cavity 20 overlies a central portion of the MEMS die 12, which includes the primary structure 24 for effectuating the MEMS functionality. For example, if the MEMS die 12 is an accelerometer, the structure 24 may include a movable mass suspended above a substrate 26.

The MEMS device 10 is considered to form a conductive rim 28 that circumscribes the MEMS structure 24 on the MEMS die 12. Among other things, the conductive rim 28 forms a hermetic seal that protects the MEMS structure 24 from the environment. For example, the hermetic seal may protect the structure 24 from dust, moisture, and dirt. In alternative embodiments, the conductive rim 28 provides a non-hermetic seal to the MEMS structure 24. As known by those in the art, a non-hermetic seal may protect the MEMS structure 24 from dust and dirt, but it is not moisture impervious. In addition to sealing the MEMS structure 24, the conductive rim 28 also electrically connects the cap 18 with the circuit die 14 through the MEMS die 12. Circuitry 30 on the circuit die 14 sets the potential of the cap 18 to ground or any desired voltage level.

In accordance with illustrative embodiments of the invention, the MEMS die 12 includes vias 32 and contacts 34 (e.g., balls of a ball grid array) that extend from the conductive rim 28, through the MEMS die 12/substrate 26 (hereinafter "die 12" for simplicity), and to the circuit die 14. Vias 32 also may be formed through the die 12 at a location that does not contact the conductive rim 28. The vias 32 illustratively are formed within the area on the die 12 defined by the conductive rim 28. For example, in some embodiments, the MEMS structure 24 is considered to form a plan projection on the surface of the die 12. Accordingly, the vias 32 are formed within that area through the die 12. Consequently, the die 12 does not have to be enlarged to accommodate a bond pad or other electrical interface. In alternative embodiments, however, vias 32 may be formed through the die 12 outside the conductive rim 28.

To form the conductive rim 28, the MEMS die 12 has a rim of polysilicon material (extending from the substrate 26 and referred to herein as the "MEMS rim 36") that integrally couples with the cap rim 22 extending from the cap 18. alternatively, the rim is comprised of silicon, metal, or other material. In illustrative embodiments, the cap rim 22 and MEMS rim 36 meet at a loosely defined intersection region 38 having a relatively high silicide concentration (discussed below with regard to FIG. 3). The concentration of silicide may be highest at the center of that intersection region 38 and reduce to essentially zero at its loosely defined ends. Moreover, the conductive rim 28 (formed from the intersection region 38, MEMS rim 36 and cap rim 22) preferably is electrically isolated from the MEMS structure 24 to ensure that the potential applied to the cap 18 is carefully controlled.

In illustrative embodiments, the MEMS rim 36 also acts as a sensor element. Alternatively, among other things, the MEMS rim 36 may act as a ground plane element, a circuit element, or dummy mechanical structure.

Figure 3:
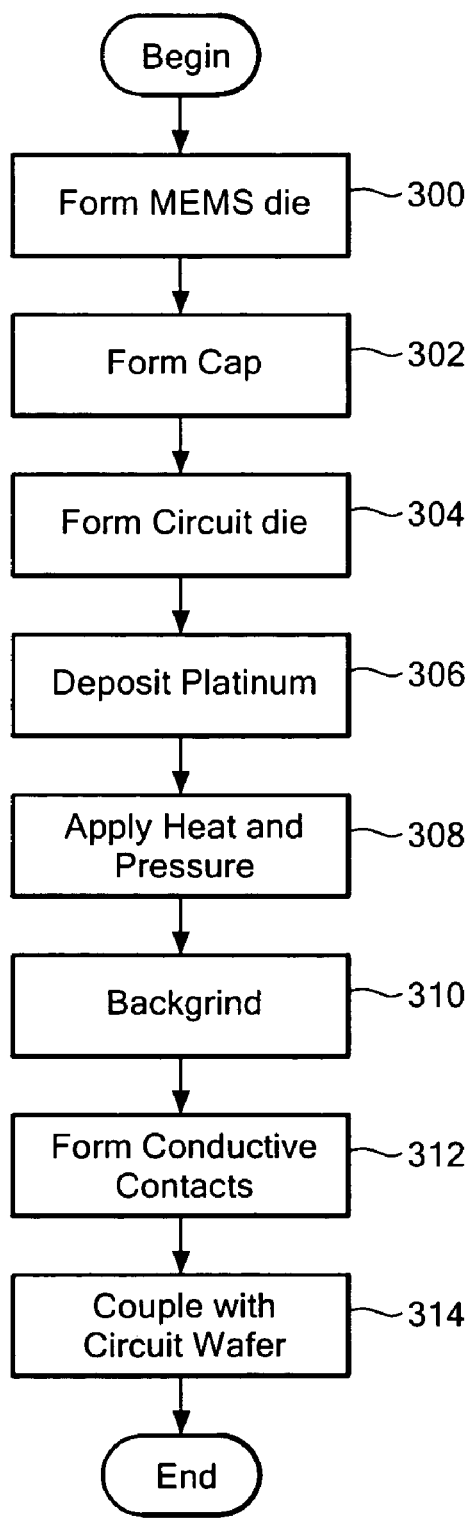
FIG. 3 shows a process of forming the electronic device shown in FIG. 2 in accordance with various embodiments of the invention.

FIG. 3 schematically shows an illustrative process of forming the MEMS device 10 shown in FIG. 2. It should be noted that various steps of this process may be performed in a different order than that discussed. In addition, those skilled in the art should understand that additional steps may be performed, while others may be omitted.

The process begins at step 300, in which the MEMS die 12 is formed by conventional processes (e.g., using surface micromachining processes to implement new process steps). If used on a silicon-on-insulator ("SOI") die 12, then conventional SOI processes may be used. As noted above, the die may be formed from a silicon-based material, such as polysilicon. In alternative embodiments, however, other types of materials may be used. For example, single crystal silicon, metal, or silicon germanium may be used for all or selected portions of the MEMS die 12. In any case, the conductivity of the vias 32, rim 36, and other conductive components should be controlled to a satisfactory level. If necessary, some doping may be required to ensure appropriate conductive properties.

The MEMS die 12 may be formed at least in part by conventional methods. See, for example, the methods discussed in the above noted and incorporated patent applications. An exemplary process of forming the vias 32 is discussed in greater detail with reference to FIG. 4.

The cap 18 then is formed at step 302. In a manner similar to the MEMS die 12, the cap 18 may be formed from polysilicon or other material in accordance with conventional processes (e.g., surface micromachining processes). The sizes of the cavity 20 and cap rim 22 illustratively are selected to ensure a sufficient clearance with the MEMS die 12. In particular, the cavity 20 should be sufficiently large enough to not interfere with movement of the structure 24 on the MEMS die 12.

The process then continues to step 304, in which conventional processes form the circuit die 14. Any conventional circuitry designed to perform the desired function can be used. For example, the circuitry shown in the above noted incorporated patents can be used. In particular, if the MEMS device 10 is an accelerometer, then the circuitry shown in U.S. Pat. No. 5,939,633 can be used to sense electrostatic changes in the MEMS die 12. It should be noted that in illustrative embodiments, the MEMS die 12, cap 18 and circuit die 14 each are formed as one of an array of identical elements on a single wafer.

Conventional processes then may metalize the bottom side of the cap 18 (step 306). For example, a layer of platinum 40 may be sputter deposited onto the bottom side of the cap 18. The metalized cap 18 then may be placed on the MEMS die 12 so that the MEMS rim 36 directly contacts the cap rim 22.

At this point in the process, the MEMS die 12 and cap 18 are not secured together. Accordingly, to fuse them together, this intermediate apparatus is subjected to relatively high temperatures and pressures (at step 308) sufficient to form a silicide bond in the intersection region 38. Those skilled in the art should be able to select the appropriate temperatures and pressures. By way of example only, subjecting the intermediate apparatus to temperatures of between about 280–450 degrees C. and pressures of about two atmospheres for about forty to fifty minutes should provide satisfactory results.

This step in the process thus produces platinum-silicide in the intersection region 38. As known by those in the art, because of the inter-diffusion of the platinum into the polysilicon, the outer portions of the two rims and the platinum between the two rims cooperate to form a substantially integral and conductive connector. The concentration of platinum thus is highest in the center of the intersection region 38 (e.g., fifty percent platinum and fifty percent polysilicon), while it reduces to zero as a function of distance from the center.

Materials other than platinum may be used to produce the silicide bond. For example, tungsten or titanium may be used. Use of such noted materials, however, typically requires higher temperatures to form their respective silicide bonds than those required of platinum. Accordingly, use of tungsten or titanium with embodiments that have circuitry 30 on the intermediate apparatus (e.g., see FIGS. 5–7, discussed below) may not be recommended because such high temperatures may adversely affect the circuitry 30. In other words, the material selected to form the silicide bond should interdiffuse (and/or melt) at a temperature that is lower than temperatures that can adversely impact the circuitry 30 or other temperature sensitive portions of the MEMS device 10.

Other types of bonds can be used. For example, rather than form a silicide bond, a solder-based bond can be used. Use of this type of bond, however, requires additional process steps. In particular, in addition to metalizing at least the cap rim 22 (as discussed above), the MEMS rim 36 also is metalized. Continuing with the above example, in a manner similar to the cap rim 22, the MEMS rim 36 also may be sputter deposited with platinum or other solderable material. Solder then can be applied and cured at relatively low temperatures.

As noted above, the conductive rim 28 illustratively completely encircles the MEMS structure 24 to provide both a hermetic seal and a conductive path between the cap 18 and circuitry 30. In some embodiments, the conductive rim 28 forms a circular ring around the structure 24. In other embodiments, the conductive rim 28 forms some other shape (e.g., oval, rectangular, or an irregular shape) around the MEMS structure 24.

After the silicide bond is formed, the process continues to step 310, in which the bottom portion of the MEMS die 12 (or wafer, as the case may be) is subjected to a thinning process (e.g., backgrinding or etch back processes) that exposes the vias 32. When exposed, the vias 32 illustratively are substantially flush with or extend slightly outwardly from the bottom facing surface of the die 12.

Conductive contacts 34 (e.g., solder balls) then can be mounted to the bottom of the vias 32 (step 312), which then can be mounted to corresponding contacts on the top surface of the circuit die 14 (step 314). Rather than solder balls, some embodiments may use plated bumps, solder balls, deposited bond pads, or other conductive interface. The wafers then can be diced, thus completing the process. As noted above, after it is fully formed, the resulting MEMS device 10 may be mounted in a package, flip chip mounted on a circuit board (after contacts are formed on one side), or used in any conventional manner.

Accordingly, as shown in FIG. 2 and discussed above, the cap 18 is electrically connected to the circuit die 14 through the conductive rim 28, corresponding vias 32, and ball contacts 34 on the bottom of the MEMS substrate 26. Parasitic capacitance should be minimized because the surface area of contact between each contact ball 34 and via 32 is relatively small. Circuitry 30 on the circuit die 14 can set the potential of the cap 18 to ground or any desired voltage level. Alternatively, the conductive path through the MEMS die 12 to the conductive rim 28 can terminate at an external pin that can be externally grounded or set to any desired potential, such as 0.2 volts.

Rather than use a capped die 12, alternative embodiments may use a packaged die 12. Specifically, at step 300, the vias 32 extend completely through the die 12 and the entire MEMS die 12 is secured within a conventional integrated circuit package (not shown). Accordingly, in this embodiment, the cap 18 may not be necessary. Those in the art should understand that the package interconnects may be coupled with the circuit board 14 in a conventional manner. In like fashion, the vias 32 also couple with the interconnects within the package.

Figure 4:
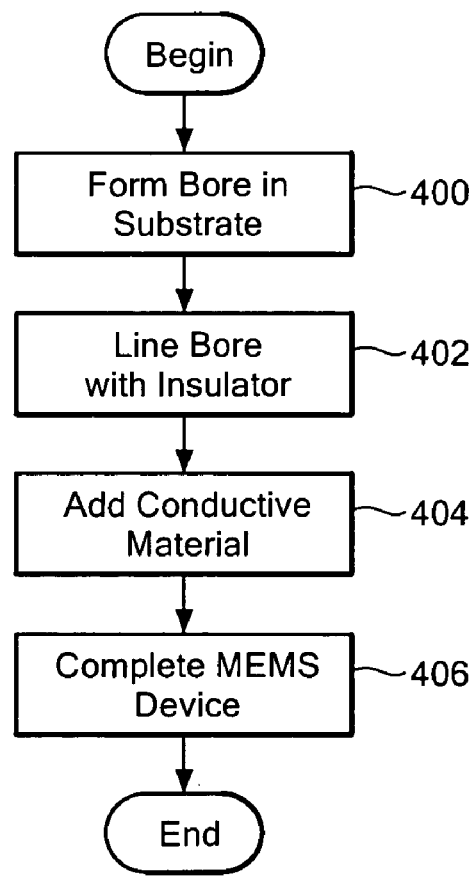
FIG. 4 shows a process of forming vias through the substrate of the device shown in FIG. 3.

FIG. 4 shows a process of forming any of the vias 32 in accordance with illustrative embodiments of the invention. The process begins at step 400, in which conventional micromachining processes form a bore in the die 12. The bore is open at the top surface of the die 12 and closed within the die 12. Accordingly, the bore does not extend through the entire die 12. The width, shape, and depth of the bore are selected based upon any number of factors. Among others, those factors may include the desired impedance of the ultimate via 32 to be formed, and the structural integrity of the ultimate via 32.

After it is formed, the bore is lined with an electrically insulating material, such as a thermal oxide or nitride (step 402). At this point in the process, the conductive vias 32 may be formed through the die 12. To that end, in some embodiments, the lined bore may be filled with a conductive material (e.g., doped silicon, conductive epoxy, CVD metal, such as tungsten or platinum, or other conductive material). After the bore is filled (i.e., forming the via 32), the remaining MEMS components and/or circuitry may be formed on the die 12.

Alternatively, as shown in FIG. 2, the next deposited layer may form both the vias 32 and other MEMS components (e.g. a movable member). In such embodiment, the vias 32 and MEMS components thus are considered to be integral. To those ends, a polysilicon layer may be deposited, which extends into the bore (step 404). The polysilicon layer may be etched and otherwise processed to form a part of the MEMS structure 24. As noted above, the added polysilicon may be doped to ensure appropriate conduction. Use of the polysilicon in this case has a number of advantages. Among others, it reduces a step in the fabrication process while reducing parasitic capacitance.

After the deposited material is added to the bore, the process continues to step 406, in which the remaining MEMS structure 24 and other portions of the die 12 are formed. As noted at step 310 in the process of FIG. 3, the die 12 subsequently is subjected to backgrinding processes, thus exposing the vias 32.

As also noted above, a similar process can be executed to form the vias 32 through a silicon on insulator die 12. Among other ways, the vias 32 can be formed through the three SOI layers in a similar manner to that discussed above. Alternatively, the vias 32 could be formed before the three layers are secured together.

Figure 5:
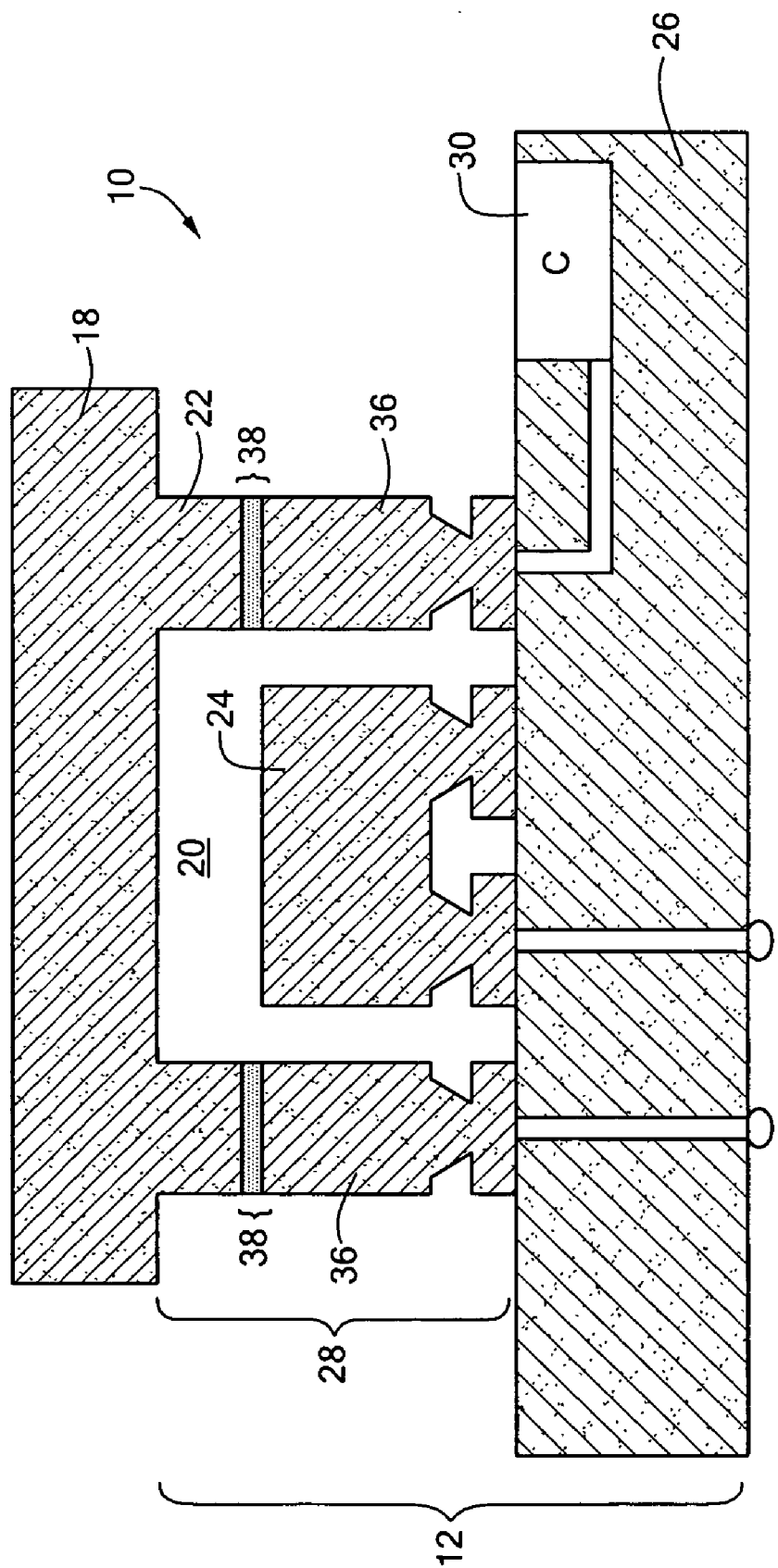
FIG. 5 schematically shows a cross-sectional view of an alternative embodiment of the invention implemented on MEMS device having circuitry and structure on the same die.

FIG. 5 shows an alternative embodiment of the MEMS device 10. Rather than have a separate circuit die 14, the MEMS die 12 may include both structure 24 and circuitry 30. In a manner similar to the MEMS die 12 shown in FIG. 2, the MEMS die 12 of this embodiment may be produced by conventional processes, such as by using surface micromachining or SOI processes to execute unique process steps.

Figure 6:
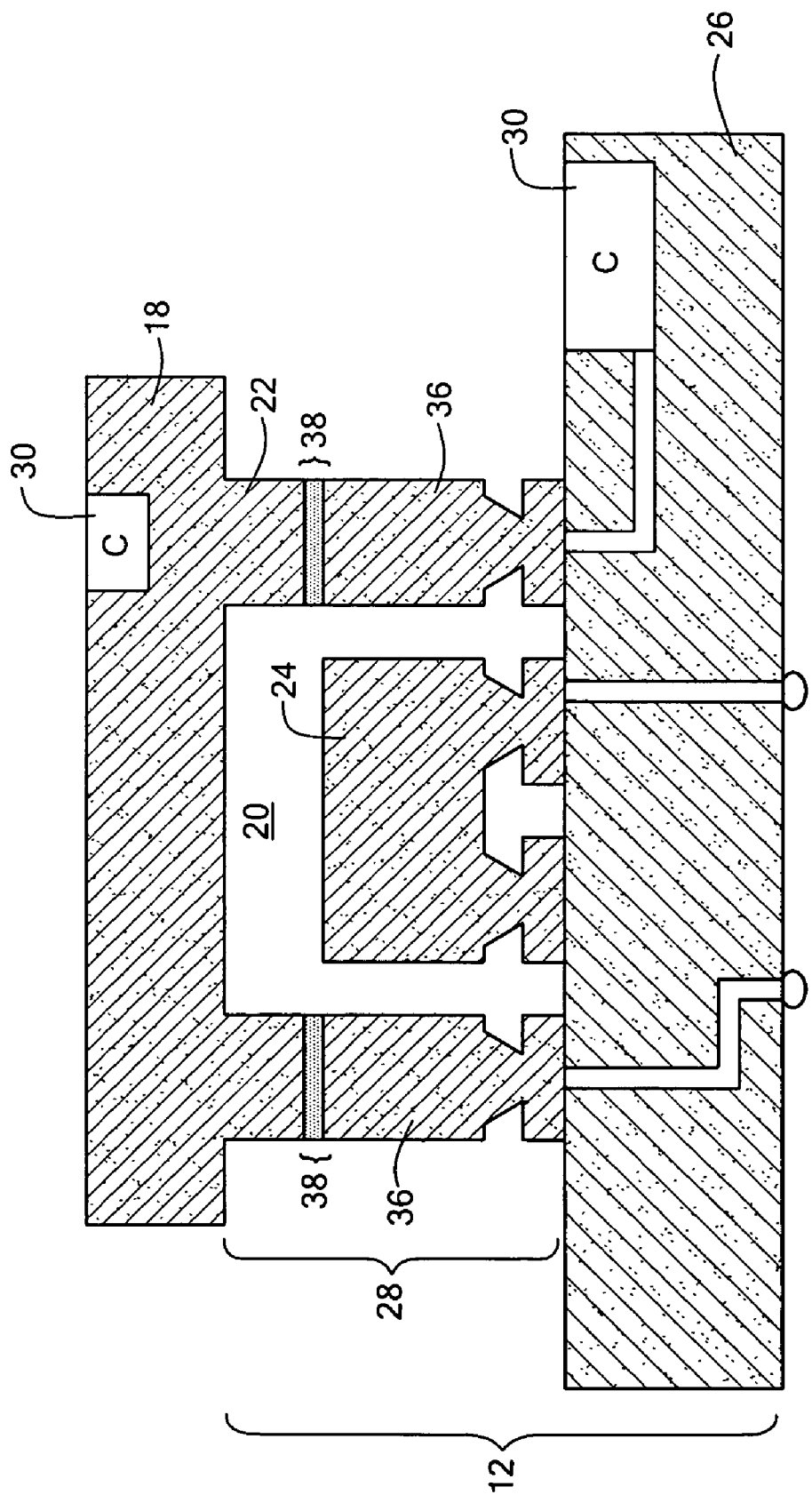
FIG. 6 schematically shows a cross-sectional view of another alternative embodiment of the invention implemented on MEMS device having circuitry and structure on the same die and circuitry on the cap.
Figure 7:
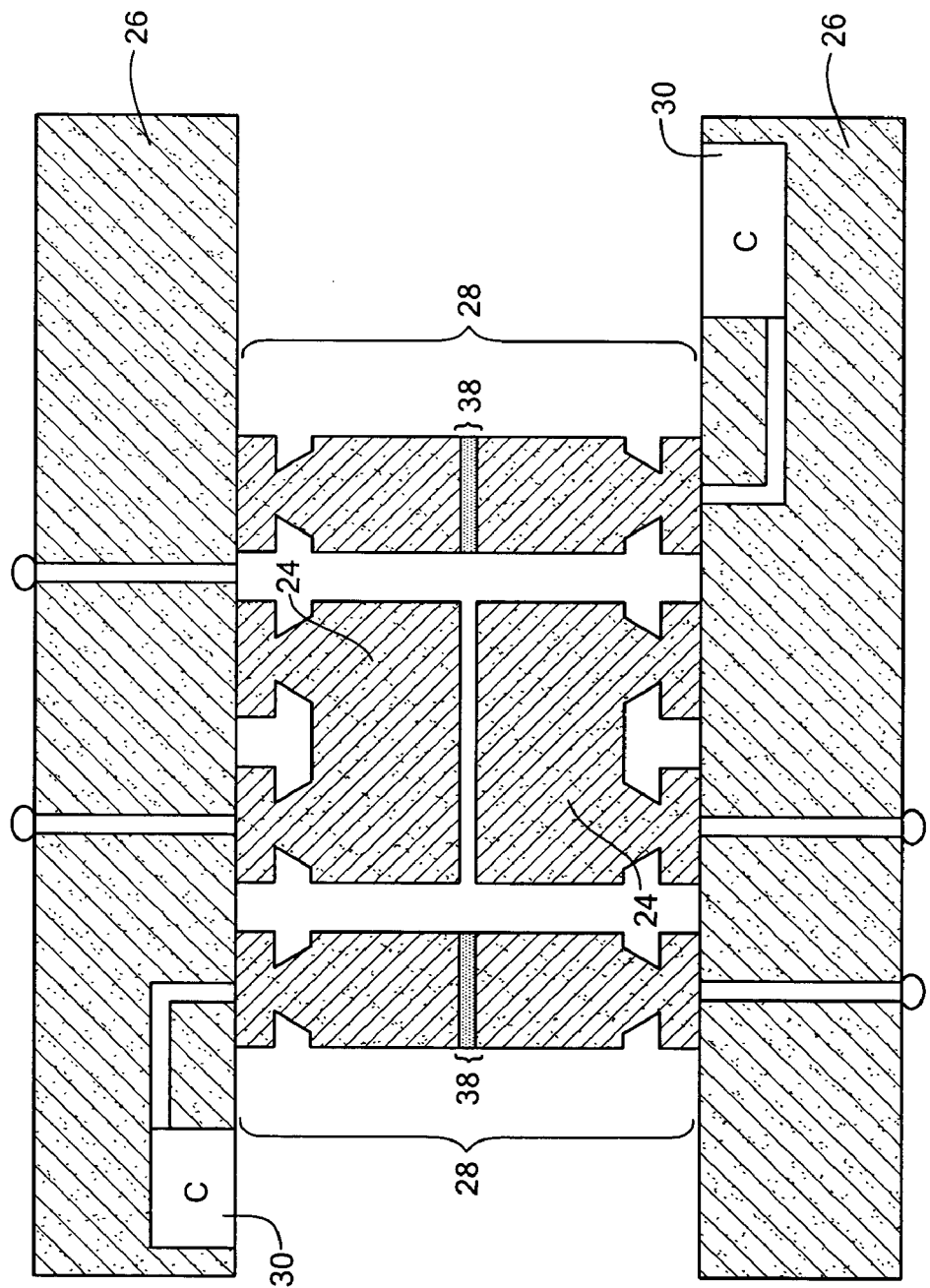
FIG. 7 schematically shows a cross-sectional view of yet another alternative embodiment of the invention implemented on a MEMS device in which the cap effectively forms another MEMS device.

FIG. 6 shows another embodiment in which a "smart cap" is used. In particular, the cap 18 may have circuitry 30 that shares or compliments processing with the circuitry 30 in the MEMS die 12. Instead of, or in addition to, bias potentials, the conductive path between the cap 18 and MEMS die 12 also can transmit data messages. FIG. 7 shows yet another embodiment in which two MEMS die 12 are mounted together. It should be noted that components of various of the embodiments shown in FIGS. 1–7 can be combined to form other embodiments. For example, instead of MEMS die 12 with integrated circuitry 30, the circuitry 30 in FIG. 6 may be located on one or more separate circuit die 14 as in FIG. 2.

Generally speaking, various embodiments of the invention have at least one via 32 extending from the MEMS structure 24 (on the top side of the die 12), through the die 12, and terminating at an electrical interface on the bottom side of the die 12. As noted above, compared to the prior art die attach pad solution, this arrangement should minimize parasitic capacitance and reduce the amount of die/substrate real estate that is necessary to produce a MEMS device.

Different materials than those discussed above also may be used. Moreover, some embodiments are applicable to devices other than MEMS devices. For example, integrated circuits and other types of devices may implement aspects of the invention. Accordingly, discussion of MEMS devices is exemplary and thus, not intended to limit all embodiments of the invention.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS device comprising:
    a substrate having a top facing side and a bottom facing side, the top facing side including MEMS structure; and
    at least one conductive path extending through the substrate from the MEMS structure to the bottom facing side, the at least one conductive path being integral with and formed from substantially the same material as the MEMS structure.

2. The MEMS device as defined by claim 1 further including a cap about at least a portion of the MEMS structure.

3. The MEMS device as defined by claim 2 wherein the cap and substrate form a cavity that at least in part contains the MEMS structure.

4. The MEMS device as defined by claim 1 wherein the at least one conductive path is substantially flush with or extends outwardly from the bottom facing side of the substrate.

5. The MEMS device as defined by claim 1 further including at least one of a plated bump, deposited bond pad, and a solder ball secured to the at least one conductive path.

6. The MEMS device as defined by claim 1 wherein the conductive path includes polysilicon.

7. The MEMS device as defined by claim 1 wherein the MEMS structure includes a movable mass.

8. The MEMS device as defined by claim 1 further including circuitry supported by the substrate, the circuitry being in electrical communication with the at least one conductive path, the substrate including silicon germanium.

9. The MEMS device as defined by claim 1 wherein the at least one conductive path is formed from a silicon-based material.

10. A MEMS device comprising:
    a substrate having a top facing side and a bottom facing side, the top facing side including MEMS structure; and
    means for conducting electrical signals between the MEMS structure and the bottom facing side, the conducting means extending through the substrate from the MEMS structure to the bottom facing side, the conducting means being integral with the MEMS structure.

11. The MEMS device as defined by claim 10 wherein the conducting means includes doped polysilicon.

12. The MEMS device as defined by claim 10 further including means for containing at least a portion of the MEMS structure.

13. The MEMS device as defined by claim 10 further including at least one of a plated bump, deposited bond pad, and a solder ball secured to the conducting means at the bottom facing surface.

14. The MEMS device as defined by claim 10 wherein the conducting means is substantially flush with or extends outwardly from the bottom facing side of the substrate.

15. The MEMS device as defined by claim 10 wherein the MEMS structure includes means for detecting motion of the substrate.

16. A MEMS system comprising:
    a first substrate having circuitry and an interface port to the circuitry;
    a MEMS device having a second substrate with a top facing side and a bottom facing side, the top facing side including MEMS structure, the MEMS device also having a conductive path extending through the second substrate from the MEMS structure to the bottom facing side, the conductive path being integral with the MEMS structure;
    the conductive path being coupled with the interface port on the first substrate to electrically communicate the circuitry with the MEMS structure.

17. The MEMS system as defined by claim 16 wherein the MEMS device is free of circuitry.

18. The MEMS device as defined by claim 16 further including a cap secured to the second substrate, the cap containing at least a portion of the MEMS structure.

19. The MEMS device as defined by claim 16 wherein the conductive path and a MEMS structure are formed from the same material.

20. The MEMS device as defined by claim 16 wherein the MEMS structure includes a movable mass.

21. The MEMS device as defined by claim 16 further including an insulator positioned between the conductive path and at least a part of the second substrate.

22. The MEMS system as defined by claim 16 wherein the MEMS structure defines a plan boundary on the second substrate, the conductive path being within the plan boundary.

23. The MEMS system as defined by claim 16 wherein the MEMS device includes circuitry.

* * * * *